(12) United States Patent
Blanchard

(10) Patent No.: US 8,105,917 B2
(45) Date of Patent: Jan. 31, 2012

(54) CONNECTION PAD STRUCTURE FOR AN IMAGE SENSOR ON A THINNED SUBSTRATE

(75) Inventor: Pierre Blanchard, Echirolles (FR)

(73) Assignee: E2V Semiconductors (FR)

( * ) Notice: Subject to any disclaimer, the term of this patent is extended or adjusted under 35 U.S.C. 154(b) by 165 days.

(21) Appl. No.: 12/518,030

(22) PCT Filed: Dec. 11, 2007

(86) PCT No.: PCT/EP2007/063691
§ 371 (c)(1),
(2), (4) Date: Jun. 22, 2009

(87) PCT Pub. No.: WO2008/074691
PCT Pub. Date: Jun. 26, 2008

(65) Prior Publication Data
US 2010/0314776 A1 Dec. 16, 2010

(30) Foreign Application Priority Data
Dec. 20, 2006 (FR) ...................................... 06 11083

(51) Int. Cl.
*H01L 21/30* (2006.01)
(52) U.S. Cl. ........................................ 438/459; 438/764

(58) Field of Classification Search ........................ None
See application file for complete search history.

(56) References Cited

U.S. PATENT DOCUMENTS

| | | | |
|---|---|---|---|
| 2004/0266052 A1 | 12/2004 | Pourquier et al. | |
| 2005/0095810 A1* | 5/2005 | Nakata et al. | 438/455 |
| 2005/0104148 A1 | 5/2005 | Yamamoto et al. | |
| 2006/0252229 A1* | 11/2006 | Joly et al. | 438/455 |
| 2007/0166956 A1* | 7/2007 | Blanchard | 438/459 |

FOREIGN PATENT DOCUMENTS

FR 2887076 12/2006

\* cited by examiner

*Primary Examiner* — Alonzo Chambliss
(74) *Attorney, Agent, or Firm* — Lowe Hauptman Ham & Berner, LLP

(57) ABSTRACT

The invention relates to the fabrication of electronic circuits on a thinned semiconductor substrate. To produce a connection pad on the back side of the thinned substrate, the procedure is as follows: an integrated circuit is produced on an unthinned substrate, in which a portion of a polycrystalline silicon layer (18) dedicated for the connection of the pad is provided. The circuit is transferred onto a transfer substrate (30) and then its back side is thinned. A via is opened in the thinned semiconductor layer (12) in order to gain access to the polycrystalline silicon; aluminum (80) is deposited and this layer is etched so as to define a pad which is in contact with the internal interconnects of the integrated circuit by way of the polycrystalline silicon.

12 Claims, 3 Drawing Sheets

CONNECTION PAD STRUCTURE FOR AN IMAGE SENSOR ON A THINNED SUBSTRATE

CROSS-REFERENCE TO RELATED APPLICATIONS

The present application is based on International Application No. PCT/EP2007/063691, filed on Dec. 11, 2007, which in turn corresponds to French Application No. 06 11083, filed on Dec. 20, 2006, and priority is hereby claimed under 35 USC §119 based on these applications. Each of these applications are hereby incorporated by reference in their entirety into the present application.

FIELD OF THE INVENTION

The invention relates to the fabrication of electronic components on a thinned semiconductor substrate. It will be described mainly with regard to a backlit image sensor on a thinned silicon substrate.

BACKGROUND OF THE INVENTION

Image sensors on a thinned substrate have been designed to improve the colorimetric performance of sensors, enabling them to be backlit via the back side of a very thin silicon layer. This arrangement prevents the dispersion of photons and photogenerated electrons in the substrate and therefore prevents crosstalk, which would impair the colorimetric response since adjacent image pixels correspond to different colors.

The fabrication of an image sensor on a thinned substrate, generally comprising the following steps, starts with a normal silicon substrate with a thickness of a few hundred microns, for industrial handling of collective wafers about ten to twenty centimeters in diameter, this substrate being coated on the front side with an epitaxial layer of single-crystal silicon, optionally isolated from the rest of the substrate by an oxide layer in the case of SOI (silicon-on-insulator) substrates. The electronic circuitry necessary for the various functions of the sensor (essentially image capture) is produced on the front side of this single-crystal layer. The substrate is then bonded, via its front side bearing this circuitry, onto a transfer substrate of sufficient thickness for industrial handling, and the starting silicon substrate is thinned down to a thickness of a few microns. The resulting very small thickness of silicon precludes industrial wafer handling, and this is the reason for the presence of the bonded transfer substrate.

One of the problems that arise in the case of these components is the formation of connection pads for connecting the component to the outside. Mounting the component in a package generally requires connecting wires to be bonded between a metal connection pad provided on the component and metal pads provided in the package.

Because the substrate in which the electronic circuits have been formed is bonded via its front side to a transfer substrate, the front side is no longer accessible. The aim is therefore to establish a connection via the back side by cutting into the thinned substrate, until a metal area that had been formed beforehand during the fabrication steps via the front face is reached.

Notably, the silicon and the insulating layers formed on the front face may be cut into up to the point where there is access to the first aluminum level. A gold connection wire is then bonded by the conventional technique of wire bonding to the bared aluminum area. However, this area is located within a cup since it was necessary to cut into the silicon and the insulating layers that covered it. This excludes the use of what are called "wedge bonding" methods as opposed to "ball bonding" methods, in which the wire (generally made of aluminum) to be bonded arrives too obliquely to be able to be bonded to the inside of a cup. This is why it is necessary to continue using gold wire bonding, even in cases where an aluminum wire would be preferred. In addition, the cup is formed in a semiconductor material, and not in an insulating material, and there are therefore risks of a short circuit between the wire and the edges of the cup.

Moreover, it should also be pointed out that the aluminum areas serving for the wire bonding must in principle be thicker than the aluminum layers that are used for ordinary interconnection functions in the integrated circuit. However, the technique explained above makes it possible in practice to gain access only to the first aluminum level (unless wishing to cut even deeper), but there is no reason for this level to be thick enough to permit bonding. To adapt this solution to an industrial operation, it would therefore be necessary to provide a first aluminum level thicker than that necessary in general, something which would require changing the standard fabrication process, which is not desirable.

This is why a novel method is proposed here for producing connection pads for an electronic component having a thinned substrate.

SUMMARY OF THE INVENTION

The method comprises the following steps:
an integrated circuit is produced on an unthinned substrate, in which a portion of a polycrystalline silicon layer dedicated for the connection of the pad is provided, this portion being in contact with an internal connection of the integrated circuit;
the circuit is transferred onto a transfer substrate and then its back side is thinned;
a via is opened in the thinned back side in order to gain access to the polycrystalline silicon; and
a metal layer is deposited on the back side and in the via, and this layer is etched so as to define a pad which is in contact with the internal connection of the integrated circuit by way of the polycrystalline silicon.

The method may comprise the following operations:
the integrated circuit is produced from the front side of a first substrate bearing a surface semiconductor layer, this production step comprising notably the formation, on the front side of the semiconductor layer, of an insulating layer covered with the portion of polycrystalline silicon layer, and then the deposition and etching of an alternation of insulating layers and metal layers with interconnects between the various metal layers and interconnects between the polycrystalline silicon layer and at least one of the metal layers;
the substrate is transferred via its front side onto the transfer substrate and bonded thereto;
the first substrate is thinned via its back side so as to retain only a semiconductor layer about 2 to 30 microns in thickness;
an aperture is cut, via the back side of the semiconductor layer, through the entire thickness of the semiconductor layer on top of an insulating layer area covered with polycrystalline silicon; and
the insulating layer is removed from the bottom of the aperture so as to bare the silicon, before the metal layer that will come into contact with the polycrystalline silicon in the aperture is deposited and etched.

It is desirable to avoid having to provide an electrical insulation between the metal layer and the semiconductor layer, as this would require additional operations. This is why it is preferable for the connection pad to be formed on an island of semiconductor layer which is completely isolated from the rest of the semiconductor layer. This island is delimited by cutting a trench all around the island during the formation of the aperture for gaining access to the polycrystalline silicon.

These are wafer-scale fabrication operations, i.e. for the mass fabrication of several integrated-circuit chips. Subsequently, the wafer will be diced into individual chips before they are mounted in packages. When mounting a chip in its package a connection wire will be bonded to the metal forming a connection pad on the island.

Since the wire is bonded to the island and not in the bottom of a cup, aluminum-wire wedge bonding methods, which are particularly reliable, may be used just as well as the more conventional gold ball bonding methods. In addition, there is no risk of a short circuit between the wire and the semiconducting layer, since there is no cup.

The desired thickness for the metal layer that serves to form the pad may be chosen, without having to choose a particular thickness for the conducting levels that were formed from the front side.

The thickness of oxide to be etched, so as to reach the polycrystalline silicon layer, may be very small—it may be equal to the thickness of the thin oxides that insulate the gates of MOS transistors in the integrated circuit (or the charge transfer gates for a CCD image sensor). This oxide is particularly easy to etch since the etching selectivity of the oxide relative to silicon may be excellent.

Contacting takes place between the metal layer that forms the pad and a polycrystalline silicon layer. The metal layer can in principle be aluminum, and contact between the aluminum and the polycrystalline silicon is particularly easy to establish. There is no risk of the aluminum of the first level, which is not bared in view of this contact, corroding.

It is unnecessary to open a large area of silicon of the substrate in order to reveal a conducting pad beneath the silicon, as previously had been necessary. It is sufficient to open point-like holes (in the form of vias) into the silicon in order to reach the polycrystalline silicon and it is sufficient to cut an insulation trench around the pad.

Beside the method that has just been described, the invention also relates to an electronic component comprising an integrated circuit produced on the front side of a thinned first silicon substrate, the thinned substrate comprising a thin semiconductor layer about 2 to 30 microns in thickness, the first substrate being mounted via its front side on a transfer substrate, characterized in that the component includes, on the accessible back side of the semiconductor layer, at least one external connection pad formed by a portion of the metal layer deposited on the semiconductor layer, the metal layer being in direct contact, through an aperture formed in the island, with a polycrystalline silicon layer formed on the front side of the thinned first substrate, the polycrystalline silicon layer itself being in contact with an internal interconnect metal layer formed on the front side of the thinned silicon substrate.

It should be noted that if the transfer substrate is itself an integrated-circuit chip, the front sides of the two integrated circuits being bonded together, the fabrication method according to the invention may also serve for connecting the two integrated circuits together. In this case, the portion of the metal layer formed on the back side of the semiconductor layer comprises not only the connection pad but also a conducting link connecting the pad to a conducting layer on the front side of the second integrated circuit (that constituting the transfer substrate). This link passes through another aperture formed in the semiconductor layer and through the insulating layers that separate the semiconductor layer from the conducting layer of the second integrated circuit.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DESCRIPTION OF THE PREFERRED EMBODIMENTS

The invention will be described with regard to an image sensor on silicon, for the acquisition of images visible at the wavelengths to which silicon is sensitive. However, the invention is applicable to sensors on substrates of other materials and for other wavelengths (for example infrared). The invention is also applicable for the combination of an integrated circuit on a thinned substrate with a conventional integrated circuit on an unthinned substrate, the conventional circuit serving in this case as transfer substrate for the thinned substrate, but connections being established between the two circuits, and the pads for connection to the outside being on the accessible back side of the circuit on a thinned substrate.

Figure 1:
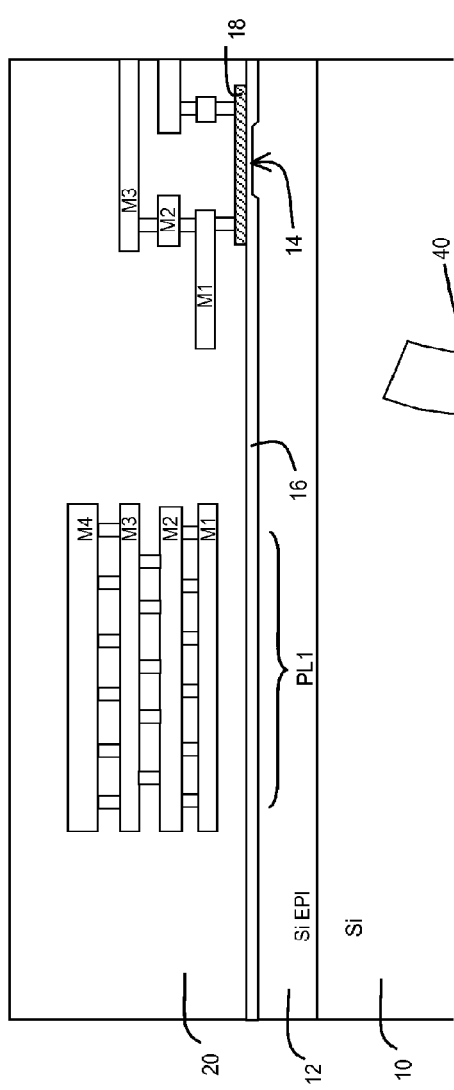
FIGS. 1 and 2 show two steps in the fabrication of an integrated circuit on a thinned substrate, in which the formation of the external connection pad has drawbacks.

FIG. 1 shows the structure of an integrated circuit produced before transfer onto a transfer substrate.

The integrated circuit is fabricated by various operations carried out on the front side of a substrate 10, the substrate being in general a silicon substrate bearing an epitaxial layer 12. These front side operations comprise the deposition of layers, the etching of layers, the diffusion of impurities and heat treatments, etc. All these "front-end" operations are carried out collectively on a wafer before the latter is divided up into individual chips. The chips are then mounted in an individual package (in back-end operations).

Among the front-end operations that are conventional and may be adopted without any modification in the method according to the invention, are at least the following:

the formation on the silicon surface 12 of portions of a thin insulating layer 14 (preferably silicon oxide) which will be located beneath the gates of MOS transistors or beneath the charge transfer gates in the case of charge coupled image sensors (CCD sensors);

the formation of portions of a thicker insulating layer 16 in other places, either by deposition or by thermal oxidation of the silicon;

the deposition and etching of a polycrystalline silicon layer 18 in order to form transistor gates or charge transfer gates; and the deposition of an alternating stack of insulating and conducting layers enabling the interconnects internal to the integrated circuit to be defined. Various techniques may be used. FIG. 1 shows an example in which several conducting layers (preferably aluminum-based layers) are distributed on several levels denoted by M1 to M4 and connected together by vias formed from another conducting metal (tungsten or titanium-tungsten), these vias passing through the insulating layers. The last insulating layer of this alternating stack is a final planarization layer on top of the interconnects.

All the insulating layers formed during the deposition of the alternating stack of insulating and conducting layers have been shown in the form of a single insulating layer 20 in which the portions of conducting layers of the levels M1 to M4 and the conducting vias between these layers, or between these layers and the layer 18, are embedded.

In order not to clutter up the figure, the diffusions of impurities into the silicon of the epitaxial layer 12, which are carried out before the alternating stack of insulating and conducting layers is deposited, have not been shown.

The left-hand part of FIG. 1 shows more especially the metal layers that will serve as contact for a connection pad to the outside. The contact will be on the first aluminum level M1, in a zone PL1. Provision may be made in this zone PL1 for the level M1 to be overhung by similar zones of the levels M2, M3 and M4, with discrete connection vias between these zones, although this is not obligatory.

The rest of the circuit fabrication is then the following: the integrated-circuit substrate is transferred onto a transfer substrate with its planarized front side (at the top in FIG. 1) bonded thereto. The bonding takes place for example by direct wafer bonding (molecular adhesion) between two extremely planar surfaces.

The operations then continue via the back side of the initial substrate, since the front side is no longer accessible.

The substrate 10 is very greatly thinned so as to keep only an extremely thin epitaxial layer 12 (2 to 5 microns in thickness for a circuit in CMOS technology and 5 to 20 microns for an image sensor in CCD technology, or even somewhat more in the case of infrared images).

After thinning, the operations necessary for producing external connection pads are carried out.

Figure 2:
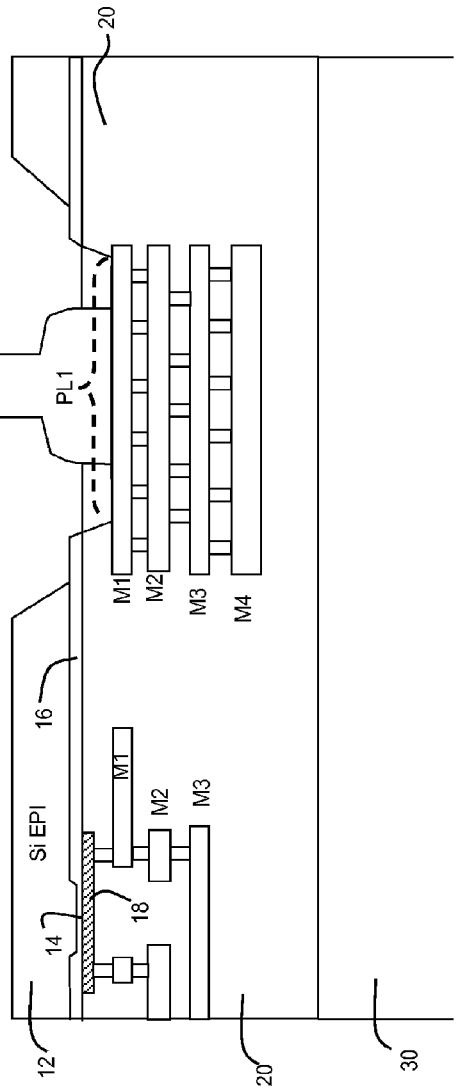

FIG. 2 shows the resulting thinned structure with a connection pad, as might be envisaged making but with certain drawbacks that the invention aims to eliminate. The integrated circuit is upside down, i.e. the front side on which the front-end operations were performed is now turned toward the bottom of the figure. It is bonded to the transfer substrate 30. The back side of the integrated circuit, at the top of the figure, essentially comprises only the epitaxial layer 12, or even just a portion of this layer.

The pad is produced solely by making an aperture in the silicon of the thinned layer 12 over its entire depth within the entire zone PL1 corresponding to the pad to be produced. The insulating layer 16 that covered the silicon in FIG. 1 is thus bared. Next, an aperture is made in this insulating layer 16 and in the subjacent insulating layer part 20 until the metal layer of the first layer M1 is bared within the entire zone PL1. The bared aluminum serves as connection pad, and a connection wire 40 may be bonded thereto.

However, the drawbacks of this solution are numerous:

1. the aluminum layer of the first level risks being too thin in a standard front-end technology. This is because it is the metal of the last level M4 which is instead generally thicker, as it serves to form the connection pads in unthinned technologies in which the pads are accessible via the front side;

2. the thickness of metal of the first level M1 could be increased, but this requires modifying the standard technology each time that a circuit on a thinned substrate is produced;

3. a deeper cut could be made, so as to reach the last (thicker) metal level M4 in order to bond the connection wire thereto, but this would make the wire bonding more difficult because of the additional depth of the pad;

4. due to the fact that the pad is sunk into a cup cut into the silicon 12 and the insulator 20, it is necessary in practice to weld a gold wire and not an aluminum wire, using a technique that introduces the wire onto the connection pad vertically, and not obliquely. The cup prevents the wire from being introduced obliquely, unless the cup is made very wide, which would be problematic; and 5. the stripping of the metal M1 (which remains stripped after wire bonding) may be a cause of future corrosion of this metal.

To remedy as far as possible these drawbacks, the invention provides a method that benefits from the fact that, for any integrated circuit in MOS or CCD technology, a polycrystalline silicon gate level (layer 18 in FIGS. 1 and 2) serving for making transistors or charge transfer gates is employed. According to the invention, a portion of this layer is dispensed with at the position of the connection pad to be produced and this portion will be connected to an internal metal connection (for example a metal connection of the first level M1) depending on the role assigned to the pad in the integrated circuit (power supply pad, ground pad, input pad, output pad, etc.). This polycrystalline silicon layer portion will serve as intermediary between the back side connection pad and the internal metal interconnects.

During the front side treatment, before transfer and thinning, the polycrystalline silicon layer is therefore etched so as to define not only the transistor gate or transfer gates, but also a layer portion reserved for subsequent formation of the pad. The pad will be formed during the back side treatment after the substrate has been thinned. In addition, again during the front side treatment, and after the polycrystalline silicon layer has been etched, the necessary contact between this layer and the rest of the integrated circuit is established, for example a contact between the polycrystalline silicon and a metal layer portion of the first level M1 which overhangs it. The rest of the front side treatment is unchanged as are the transfer and the thinning.

During the back side treatment after thinning, apertures are made locally in the silicon so as to gain access to the polycrystalline silicon layer, and then a metal layer will be deposited that comes into contact with the polycrystalline silicon. It is this back side layer, and not a layer deposited during the front side treatment, which will form a connection pad.

Figure 3:
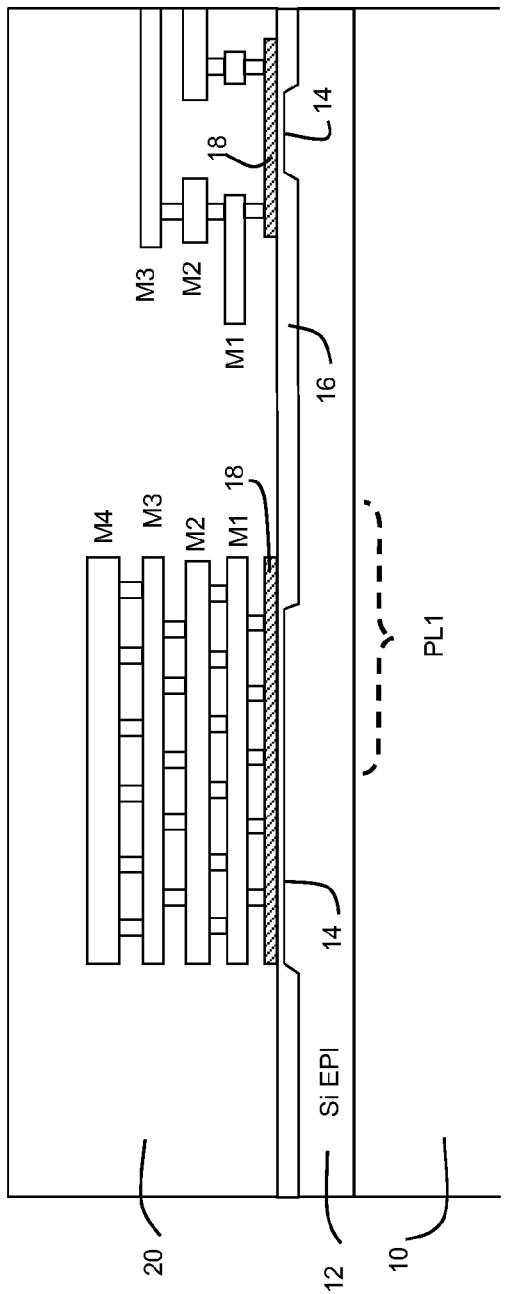
FIG. 3 shows a step in the fabrication of an integrated circuit using the method according to the invention, before transfer and thinning.

Thus, FIG. 3 shows the integrated circuit according to the invention after the front side treatment, the front side being at the top. Indicated in the figure by the reference PL1 is the zone in which the connection pad will be. A portion of the polycrystalline silicon layer connected to the first metal level M1 partly overhangs the zone PL1. The electrical connection between the polycrystalline silicon and the metal may be made by one or more conventional vias, for example made of tungsten or a tungsten/titanium alloy.

Layer portions of the other levels, connected to one another by vias, may overhang the layer portion 18, but this is not obligatory. The polycrystalline silicon layer portion that will serve to form the connection pad may be located on a thin insulator layer 14 (as in FIG. 3) or on a thicker insulator layer 16.

The fabrication steps carried out on the front side are standard—only the layer etching pattern and the interconnects differ from the technique explained with reference to FIG. 1.

At the end of the front-side wafer-scale fabrication steps, the wafer is bonded via its front side to the transfer substrate. The following steps are performed via the back side.

Figure 4:
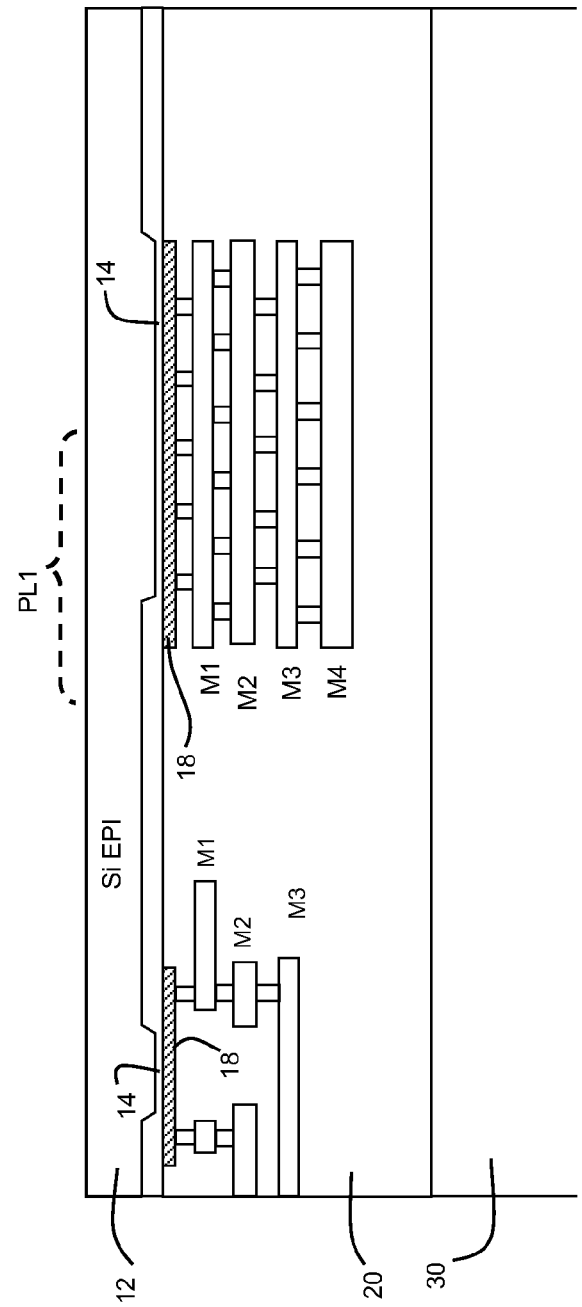
FIG. 4 shows the transfer and thinning steps.

FIG. 4 shows the inverted integrated circuit, with the back side uppermost, after being bonded to a transfer substrate 30 and after the silicon has been thinned down to a few microns in thickness.

Figure 5:
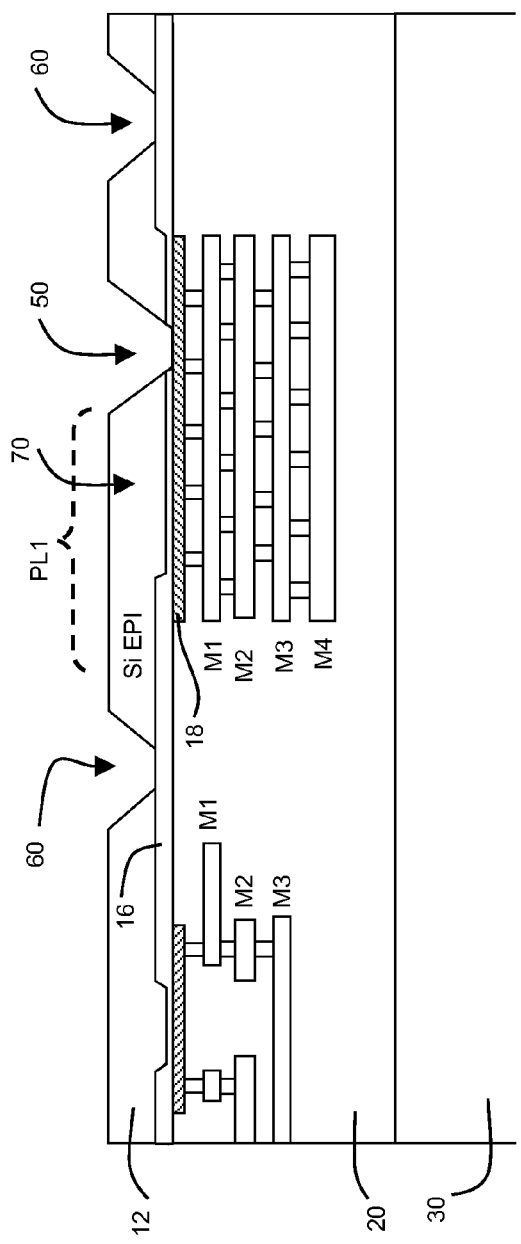
FIG. 5 shows the step of making apertures in the back side before deposition of a connection pad.

FIG. 5 shows the next fabrication step: the silicon of the semiconductor layer 12 is etched over its entire thickness so as to form at least one aperture 50 above the polycrystalline silicon layer portion reserved for formation of the connection pad.

Preferably, this etching operation is profitably used for also cutting, over the entire thickness of the silicon down to the insulating layer 16, a peripheral trench 60 that completely surrounds both the zone PL1 reserved for the connection pad, and the aperture 50. This trench 60 defines a single-crystal silicon island 70 which is completely isolated electrically from the rest of the silicon and encompasses the zone PL1. There is a different island for each connection pad.

It should be noted that, contrary to what was done in the case of FIG. 2, the etching of the silicon 12 does not take place throughout the zone PL1 but only around this zone (for the isolation of the island) and at discrete contact points (for a contact at one or more points with the layer 18). It should also be noted that the silicon etching is particularly easy, as it stops on the insulating layer 14 or 16 (in general, silicon oxide) and not on aluminum.

The thin insulating layer 14 present at the bottom of the aperture 50 is then removed, so as to bare the polycrystalline silicon. Here again, this operation is very easy because of the etching selectivity between silicon and oxide. There is even no need for an etching mask.

The actual connection pad can then be formed: a metal layer 80, preferably an aluminum layer, optionally a sandwich comprising an aluminum layer and titanium nitride, is deposited. The layer is deposited on the back side of the polycrystalline silicon and in the apertures and trenches. This layer is etched so as to delimit a confined pad on the silicon island and a zone covering the aperture 50 so as to establish a contact between the pad and the bared polycrystalline silicon layer at the bottom of the aperture. The metal in the trench 60 is then removed. The aluminum thickness is chosen to be sufficient for it to fulfill the role of a connection pad.

The aluminum may also serve for other purposes, such as a back side contact for an image sensor matrix.

The mass fabrication is then complete. After the wafer has been diced into individual chips, these are mounted in packages and a connection wire may be bonded to the pads by the desired method, the pads not being sunk in a cup.

Figure 6:
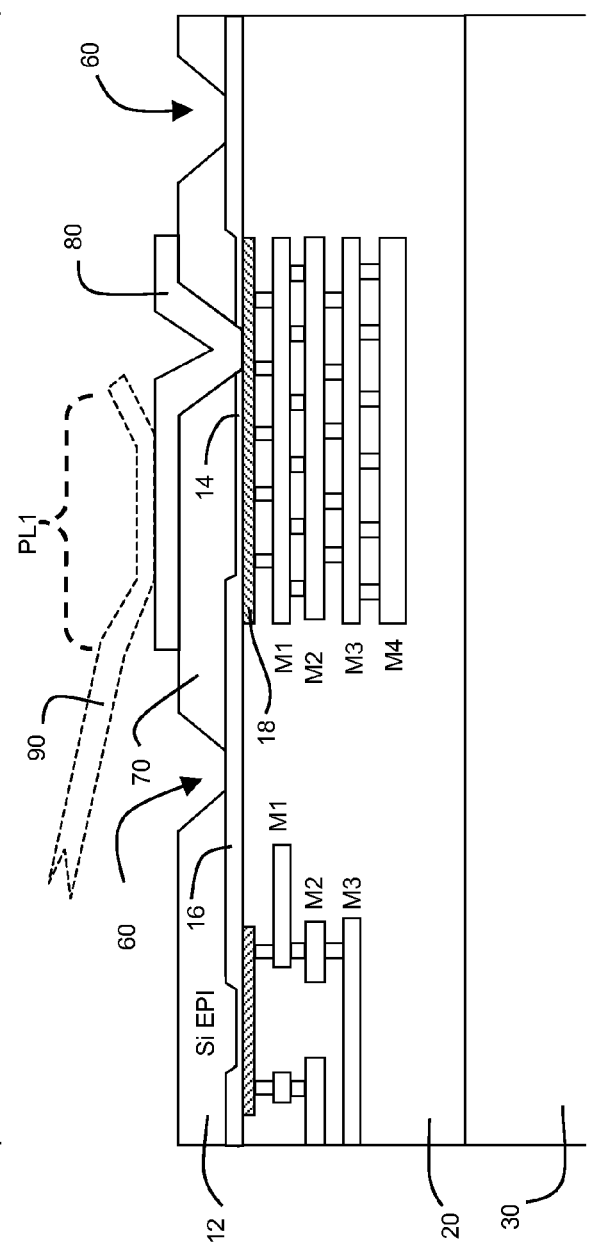
FIG. 6 shows the component according to the invention with its connection pad.

In FIG. 6, the connection wire 90 that will be bonded after the wafer has been diced into individual chips is shown by the dotted lines. It may be seen that this wire may be introduced at very oblique incidence.

In the figures, the aperture 50 for the contact was considered to be offset relative to the pad zone PL1 to which the wire is bonded. The aperture 50 could also be located in the zone PL1. The aperture 50 is a point-like aperture—it occupies a small area compared with the area of the pad. There may be several apertures 50 for better current flow, and these are distributed within the zone PL1 or around the zone PL1, but always within the isolated island 70.

As mentioned above, the transfer substrate may be a conventional integrated circuit on an unthinned substrate, for example in an application in which an image sensor thinned via its front side is bonded to the front side of a circuit for processing the images collected by the sensor. In this case, the two circuits have to be connected together. To do this, provision is made for the single-crystal silicon etching 12 to also include the formation of an additional aperture (inside the island 70, and therefore within the perimeter of the trench 60), this aperture not being located opposite conducting layers, such as 18, M1, M2, M3, M4. Next, an additional step of etching the insulating layers is provided so as to create an aperture through the entire superposition of insulating layers 20 down to the front side of the unthinned integrated circuit, and the etching continues until a conducting level of the second, unthinned, integrated circuit is encountered. This conducting level is for example a final level conductor (such as the level M4 described above) of the second circuit. During deposition of the metal layer 80, the latter comes into contact through the aperture thus formed with this conducting level. During etching of the metal layer 80, not only is the connection pad delimited but also an electrical link that connects this pad to the second integrated circuit.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method for producing a connection pad on an electronic component, comprising the following steps:

producing an integrated circuitry on a first substrate, said circuitry comprising at least one internal conductive connection and a portion of a polycrystalline silicon layer dedicated for the connection of the pad, said portion of polycrystalline silicon layer being in contact with said internal conductive connection of the integrated circuitry;

transferring a front side of said first substrate onto a transfer substrate and then thinning said first substrate from a back side thereof;

opening an aperture in the thinned back side and baring said portion of polycrystalline silicon in said aperture; and depositing a metal layer on said thinned back side and in the aperture, and etching said metal layer so as to define said pad which is in electrical contact with the internal connection of the integrated circuitry by way of said polycrystalline silicon layer.

2. The method as claimed in claim 1, wherein:

said first substrate comprises on its front side a surface semiconductor layer having a front side and a back side, and the step of producing the integrated circuitry comprises the formation, on the front side of the semiconductor layer, of an insulating layer, then the formation of the portion of polycrystalline silicon layer on said insulating layer, and then the deposition and etching of an alternation of insulating layers and metal layers with interconnects between the various metal layers and interconnects between said polycrystalline silicon layer and at least one of the metal layers;

the step of thinning said first substrate comprises retaining only a semiconductor layer about 2 to 30 microns in thickness;

the step of opening the aperture comprises locally etching the back side of the semiconductor layer, through the entire thickness of the semiconductor layer on top of a portion of said insulating layer area covered with polycrystalline silicon; and removing the insulating layer at a bottom of the aperture so as to bare the polycrystalline.

3. The method as claimed in claim 2, wherein, during the operation of locally etching the semiconductor layer, through the entire thickness thereof, a peripheral trench is etched that completely surrounds both the pad and the aperture formed in the semiconductor layer.

4. The method as claimed in claim 3, wherein the transfer substrate is an integrated circuit chip.

5. The method as claimed in claim 3, wherein the metal deposited on the back side is an aluminum-based metal.

6. The method as claimed in claim 2, wherein the metal deposited on the back side is an aluminum-based metal.

7. The method as claimed in claim 6, wherein the transfer substrate is an integrated circuit chip.

8. The method as claimed in claim 2, wherein the transfer substrate is an integrated circuit chip.

9. An electronic component comprising an integrated circuit produced on the front side of a thinned first silicon substrate, the thinned substrate comprising a thin semiconductor layer about 2 to 30 microns in thickness, the first substrate being mounted via its front side on a transfer substrate, wherein the component includes, on the accessible back side of the semiconductor layer, at least one external connection pad formed by a portion of the metal layer deposited on the semiconductor layer, the metal layer being in direct contact, through an aperture formed in the semiconductor layer, with a polycrystalline silicon layer formed on the front side of the thinned first substrate, the polycrystalline silicon layer itself being in contact with a metal layer formed on the front side of the thinned silicon substrate.

10. The component as claimed in claim 9, wherein the aperture formed in the semiconductor layer is formed in a semiconductor layer island that is entirely isolated electrically, by a trench surrounding this island, from the rest of the semiconductor layer.

11. The electronic component as claimed in claim 10, wherein the transfer substrate is an integrated-circuit chip.

12. The electronic component as claimed in claim 9, wherein the transfer substrate is an integrated-circuit chip.

* * * * *